United States Patent
Park et al.

(10) Patent No.: US 9,647,201 B2
(45) Date of Patent: May 9, 2017

(54) MAGNETIC MEMORY DEVICES

(71) Applicants: Jongchul Park, Seongnam-si (KR); Kyung Rae Byun, Suwon-si (KR)

(72) Inventors: Jongchul Park, Seongnam-si (KR); Kyung Rae Byun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/729,536

(22) Filed: Jun. 3, 2015

(65) Prior Publication Data
US 2016/0093799 A1    Mar. 31, 2016

(30) Foreign Application Priority Data
Sep. 26, 2014  (KR) .................. 10-2014-0129348

(51) Int. Cl.
| H01L 29/82 | (2006.01) |
| H01L 43/08 | (2006.01) |
| G11C 11/16 | (2006.01) |
| H01L 27/22 | (2006.01) |
| H01L 43/12 | (2006.01) |

(52) U.S. Cl.
CPC ............ *H01L 43/08* (2013.01); *G11C 11/161* (2013.01); *H01L 27/228* (2013.01); *H01L 43/12* (2013.01)

(58) Field of Classification Search
CPC ......... H01L 43/08; H01L 43/02; H01L 43/12; H01L 27/222; H01L 27/228; G11C 11/161
See application file for complete search history.

(56) References Cited

U.S. PATENT DOCUMENTS

| 6,621,730 B1* | 9/2003 | Lage | B82Y 10/00 257/E21.665 |
| 7,508,041 B2* | 3/2009 | Noh | H01L 27/228 257/422 |
| 8,334,148 B2 | 12/2012 | Jeong et al. | |
| 8,422,275 B2 | 4/2013 | Hwang et al. | |
| 8,441,083 B2 | 5/2013 | Tsukamoto et al. | |
| 8,575,753 B2 | 11/2013 | Choi et al. | |
| 8,674,465 B2 | 3/2014 | Li et al. | |
| 8,716,818 B2 | 5/2014 | Yoshikawa et al. | |
| 2006/0097333 A1* | 5/2006 | Jeong | G11C 11/16 257/425 |
| 2006/0220084 A1* | 10/2006 | Umehara | B82Y 10/00 257/296 |
| 2007/0242505 A1* | 10/2007 | Ochiai | G11C 11/14 365/171 |
| 2008/0160643 A1* | 7/2008 | Park | B82Y 10/00 438/3 |
| 2009/0197350 A1 | 8/2009 | Hwang et al. | |

(Continued)

Primary Examiner — Thanh Y Tran
(74) Attorney, Agent, or Firm — Harness, Dickey & Pierce, P.L.C.

(57) ABSTRACT

The inventive concepts provide magnetic memory devices. The device includes a first magnetic pattern provided in one united body on a substrate and having a plurality of through-holes, a plurality of second magnetic patterns spaced apart from each other on the first magnetic pattern, a tunnel barrier between the first magnetic pattern and the second magnetic patterns, top electrodes disposed on the second magnetic patterns, respectively, and a plurality of plugs electrically connecting the top electrodes to the substrate through the through-holes, respectively.

13 Claims, 23 Drawing Sheets

(56) References Cited

U.S. PATENT DOCUMENTS

| | | |
|---|---|---|
| 2010/0301480 A1 | 12/2010 | Choi et al. |
| 2011/0149670 A1 | 6/2011 | Heo et al. |
| 2011/0272380 A1 | 11/2011 | Jeong et al. |
| 2012/0032287 A1 | 2/2012 | Li et al. |
| 2012/0211847 A1 | 8/2012 | Tsukamoto et al. |
| 2012/0306004 A1 | 12/2012 | Yoon et al. |
| 2013/0001652 A1 | 1/2013 | Yoshikawa et al. |
| 2013/0001715 A1 | 1/2013 | Yamakawa et al. |
| 2014/0021426 A1 | 1/2014 | Lee et al. |
| 2014/0042567 A1 | 2/2014 | Jung et al. |
| 2014/0070162 A1* | 3/2014 | Iwayama ............... H01L 43/08 257/4 |
| 2014/0084402 A1 | 3/2014 | Shimomura et al. |
| 2014/0117477 A1 | 5/2014 | Park et al. |
| 2014/0117478 A1 | 5/2014 | Ikeno et al. |
| 2015/0263068 A1* | 9/2015 | Ito ......................... H01L 27/228 365/158 |
| 2015/0263270 A1* | 9/2015 | Kitagawa ............. H01L 27/228 257/421 |
| 2015/0287907 A1* | 10/2015 | Park ....................... H01L 43/08 257/421 |

\* cited by examiner

MAGNETIC MEMORY DEVICES

CROSS-REFERENCE TO RELATED APPLICATION

This U.S. non-provisional patent application claims priority under 35 U.S.C. §119 to Korean Patent Application No. 10-2014-0129348, filed on Sep. 26, 2014, in the Korean Intellectual Property Office, the disclosure of which is hereby incorporated by reference in its entirety.

BACKGROUND

The inventive concepts relate to semiconductor devices. More particularly, the inventive concepts relate to magnetic memory devices.

As semiconductor memory devices with fast read/write operations and low-operating voltage have been demanded, high-speed and low-power consumption electronic devices have been developed. Magnetic memory devices, which correspond to semiconductor memory devices, have been developed to satisfy the above demands. The magnetic memory devices have been spotlighted as next-generation memory devices because of their high-speed and non-volatile characteristics.

The magnetic memory device may include a magnetic tunnel junction (MTJ). The MTJ may include two magnetic layers and a tunnel barrier layer disposed between the two magnetic layers. A resistance value of the MTJ may be changed depending on magnetization directions of the two magnetic layers. For example, if the magnetization directions of the two magnetic layers are anti-parallel to each other, the MTJ may have a relatively high resistance value. If the magnetization directions of the two magnetic layers are parallel to each other, the MTJ may have a relatively low resistance value. The magnetic memory device may write/read data in/from the MTJ by means of a difference between the resistance values of the MTJ.

Highly integrated and/or low power consumption magnetic memory devices have been increasingly demanded with the development of an electronic industry. The various researches are being conducted for satisfying these demands.

SUMMARY

Embodiments of the inventive concepts may provide highly-integrated memory devices.

Embodiments of the inventive concepts may also provide memory devices with excellent reliability.

According to embodiments of the inventive concepts, a magnetic memory device may include: a first magnetic pattern provided in one united body on a substrate and having a plurality of through-holes; a plurality of second magnetic patterns spaced apart from each other on the first magnetic pattern; a tunnel barrier between the first magnetic pattern and the second magnetic patterns; top electrodes disposed on the second magnetic patterns, respectively; and a plurality of plugs electrically connecting to the top electrodes the through-holes, respectively.

In some embodiments, the first magnetic pattern may have a fixed magnetization direction, and each of the second magnetic patterns may have a changeable magnetization direction.

In some embodiments, each of the plugs may include: a first plug disposed in a first interlayer insulating layer disposed between the substrate and the first magnetic pattern; a second plug disposed in the through-hole and a second interlayer insulating layer disposed between the second magnetic patterns; and a connection pad between the second plug and the top electrode. The first plugs may not vertically overlap with the second magnetic patterns. The device may further include first spacers on sidewalls of the second magnetic patterns. The first spacers may include a different material from the second interlayer insulating layer. Sidewalls of the through-holes may be self-aligned with sidewalls of the first spacers. The device may further include: second spacers on sidewalls of the through-holes. The second plugs may be electrically insulated from the first magnetic pattern by the second spacers. The through-holes may further penetrate the tunnel barrier, and the tunnel barrier may extend between the second interlayer insulating layer and the first magnetic pattern.

According to embodiments of the inventive concepts, a magnetic memory device may include: a first magnetic pattern provided on a substrate and having a plurality of through-holes, the first magnetic pattern having a plate shape; a plurality of second magnetic patterns disposed on the first magnetic pattern, the plurality of second magnetic patterns laterally offset from the through-holes; and a tunnel barrier between the first magnetic pattern and the second magnetic patterns.

In some embodiments, the first magnetic pattern may have a fixed magnetization direction, and each of the second magnetic patterns may have a changeable magnetization direction.

In some embodiments, the device may further include plugs disposed in the through-holes to electrically connect the second magnetic patterns to selection elements of the substrate, respectively.

In some embodiments, the device may further include first spacers disposed on sidewalls of the second magnetic patterns, respectively. The device may further include second spacers disposed on sidewalls of the through-holes to separate the plugs from the first magnetic pattern. The second spacers may extend onto the first spacers.

In some embodiments, each of the through-holes may be disposed between the plurality of second magnetic patterns among the plurality of second magnetic patterns.

According to embodiments of the inventive concepts, a magnetic memory device may include: a substrate having a device isolation layer defining an active region; a pair of word lines extending in a first direction to intersect the active region; plugs respectively connected to dopant regions provided in the active region at both sides of the pair of word lines; and magnetic tunnel junctions not vertically overlapped with the plugs. Each of the plugs may be laterally spaced apart by the same distance from a plurality of adjacent magnetic tunnel junctions.

In some embodiments, the plurality of adjacent magnetic tunnel junctions may be spaced apart from each other at equal distances.

In some embodiments, each of the plugs may be disposed at a center between the plurality of adjacent magnetic tunnel junctions.

In some embodiments, the magnetic tunnel junctions may include: a first magnetic pattern provided in one united body and having a plate shape; a plurality of second magnetic patterns disposed on the first magnetic pattern; and a tunnel barrier between the first magnetic pattern and the second magnetic patterns. The plugs may penetrate the first magnetic pattern and may be connected to the second magnetic patterns through connection pads disposed on the plugs, respectively.

BRIEF DESCRIPTION OF THE DRAWINGS

The inventive concepts will become more apparent in view of the attached drawings and accompanying detailed description.

FIGS. 6A to 13A are cross-sectional views corresponding to the line I-I' of FIG. 4 to illustrate a method of manufacturing a magnetic memory device according to some embodiments of the inventive concepts;

FIGS. 6B to 13B are cross-sectional views corresponding to the line II-II' of FIG. 4 to illustrate a method of manufacturing a magnetic memory device according to some embodiments of the inventive concepts;

DETAILED DESCRIPTION OF EXAMPLE EMBODIMENTS

Figure 1:
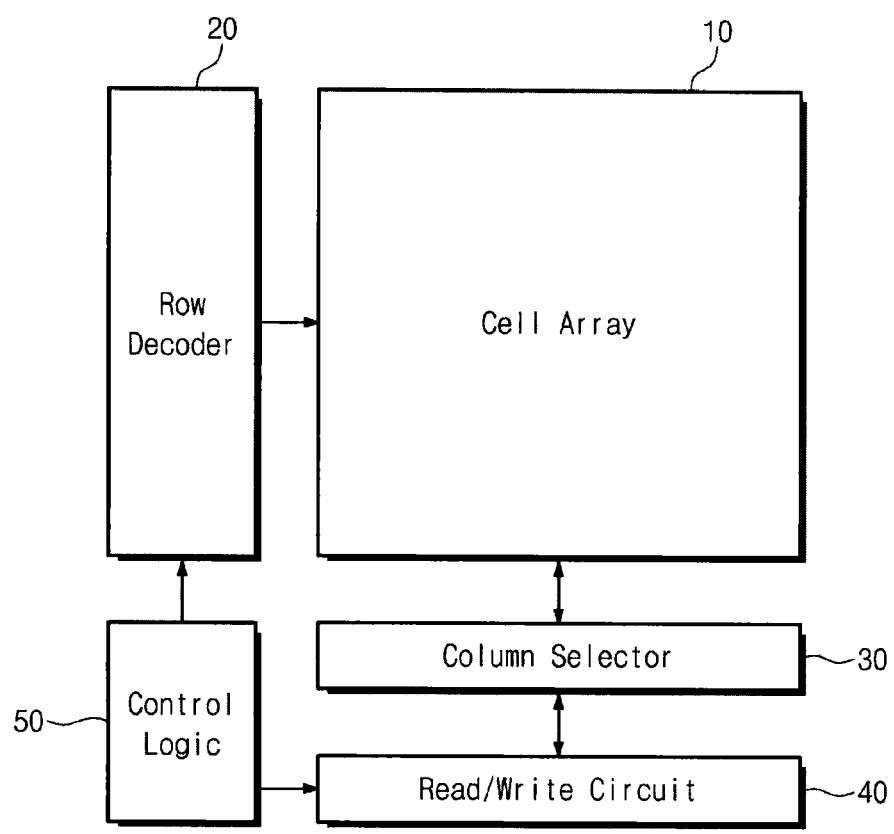
FIG. 1 is a schematic block diagram illustrating a memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a memory device according to example embodiments of the inventive concepts. Referring to FIG. 1, a memory device may include a memory cell array 10, a row decoder 20, a column selector circuit 30, a read/write circuit 40, and a control logic circuit 50.

The memory cell array 1 may include a plurality of word lines, a plurality of bit lines, and memory cells connected between the word lines and the bit lines. The memory cell array 10 will be described in more detail with reference to FIG. 2.

The row decoder 20 may be connected to the memory cell array 10 through the word lines. The row decoder 20 may decode an address signal inputted from an external system to select one among the word lines.

The column selector circuit 30 may be connected to the memory cell array 10 through the bit lines and may decode an address signal inputted from the external system to select one among the bit lines. The bit line selected by the column selector circuit 30 may be connected to the read/write circuit 40.

The read/write circuit 40 may provide a bit line bias used for accessing a selected memory cell in response to a control signal of the control logic circuit 50. The read/write circuit 40 may provide a bit line voltage into the selected bit line to write inputted data into the selected memory cell and/or to read data from the selected memory cell.

The control logic circuit 50 may output control signals used for controlling the memory device in response to command signals provided from the external system. The read/write circuit 40 may be controlled by at least one of the control signals outputted from the control logic circuit 50.

Figure 2:
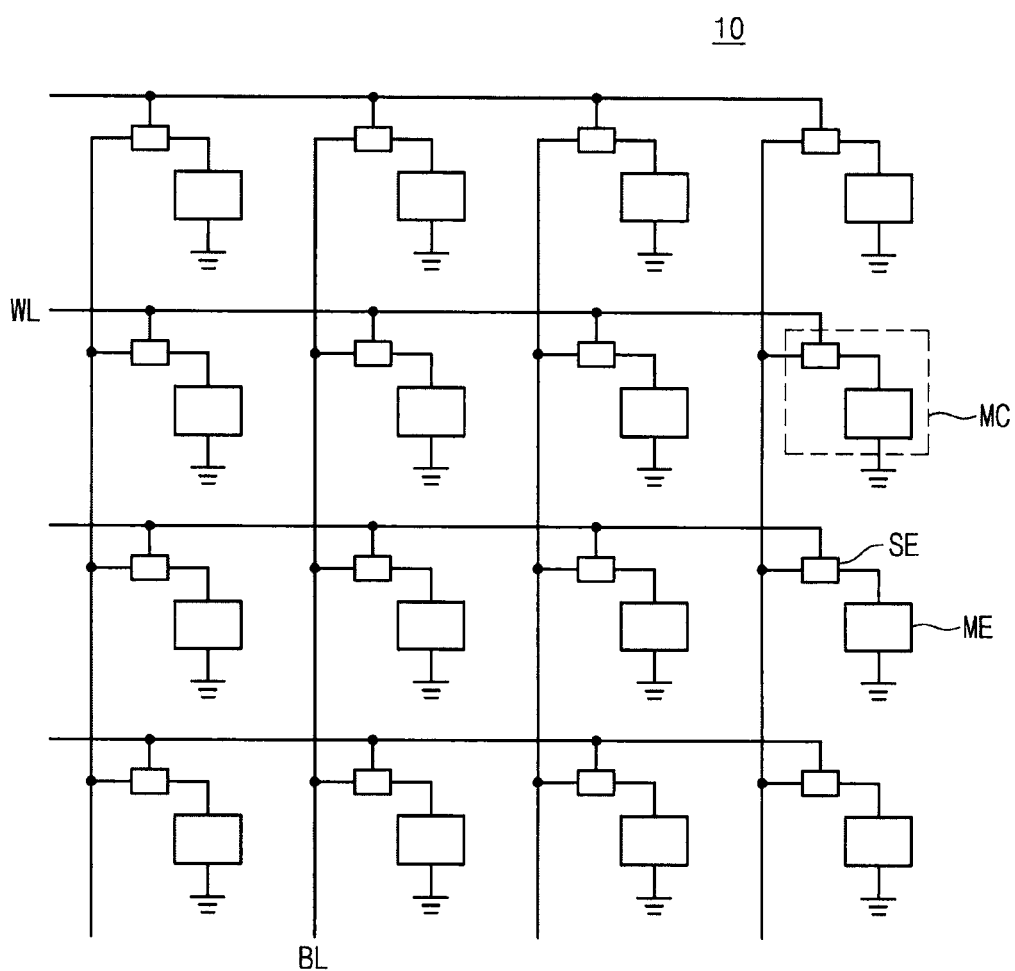
FIG. 2 is a circuit diagram illustrating a memory cell array of a memory device according to example embodiments of the inventive concepts.

FIG. 2 is a circuit diagram illustrating a memory cell array of a memory device according to example embodiments of the inventive concepts. Referring to FIG. 2, the memory cell array 10 may include a plurality of first conductive lines, a plurality of second conductive lines, and unit memory cells MC. The first conductive lines may be word lines WL, and the second conductive lines may be bit lines BL. The unit memory cells MC may be two-dimensionally or three-dimensionally arranged. The unit memory cells MC may be connected between the word lines WL and the bit lines BL crossing the word lines WL. Each of the word lines WL may be connected to a plurality of unit memory cells MC. Each of the bit lines BL may be connected to each of the unit memory cells MC connected to one word line WL. Thus, each of the unit memory cells MC connected to the one word line WL may be connected to the read/write circuit 40 of FIG. 1 through each of the bit lines BL.

Each of the unit memory cells MC may include a memory element ME and a selection element SE. The memory element ME may be connected to the bit line BL and the selection element SE. The selection element SE may be connected to the memory element ME, the word line WL and the bit line BL. The memory element ME may include a variable resistance element that is switchable between two resistance states by an electrical pulse applied thereto.

According to an embodiment, the memory element ME may have a thin-layered structure of which an electrical resistance can be changed using spin-transfer torque of a current passing through the thin-layered structure. For example, the memory element ME may have the thin-layered structure exhibiting a magnetoresistance property and may include at least one ferromagnetic material and/or at least one anti-ferromagnetic material. In more detail, the memory element ME may be a magnetic memory element including a magnetic tunnel junction (MTJ).

Figure 3A:
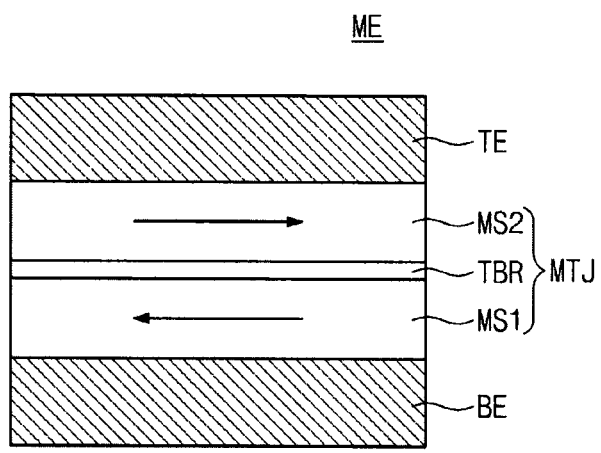
FIGS. 3A and 3B are cross-sectional views illustrating magnetic tunnel junctions (MTJs) according to example embodiments of the inventive concepts.
Figure 3B:
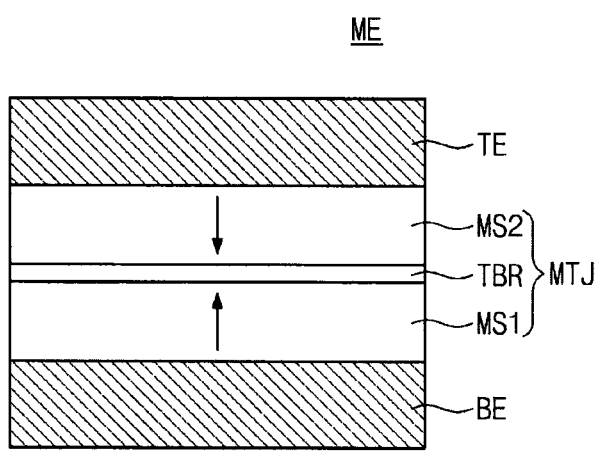

The selection element SE may be configured to selectively control a flow of charges passing through the memory element ME. For example, the selection element SE may be one of a diode, a PNP bipolar transistor, an NPN bipolar transistor, an NMOS field effect transistor, and a PMOS field effect transistor. FIGS. 3A and 3B are cross-sectional views illustrating magnetic tunnel junctions (MTJs) according to example embodiments of the inventive concepts. Referring to FIGS. 3A and 3B, a magnetic tunnel junction MTJ may include a first magnetic pattern MS1, a second magnetic pattern MS2, and a tunnel barrier TBR disposed between the first and second magnetic patterns MS1 and MS2. Each of the first and second magnetic patterns MS1 and MS2 may include a magnetic material. The magnetic tunnel junction MTJ may be disposed between a bottom electrode BE and a top electrode TE.

Under a general use environment, a magnetization direction of the first magnetic pattern MS1 may be fixed regardless of an external magnetic field. The first magnetic pattern MS1 having the fixed magnetization direction is defined as a pinned layer. A magnetization direction of the second magnetic pattern MS2 may be switchable by an external field applied to the second magnetic pattern MS2. The second magnetic pattern MS2 having the switchable magnetization direction is defined as a free layer.

An electrical resistance of the magnetic tunnel junction MTJ may depend on the magnetization directions of the free layer and the pinned layer. In some embodiments, the electrical resistance of the magnetic tunnel junction MTJ may be much greater when the magnetization directions of the free and pinned layers are anti-parallel to each other than when they are parallel to each other. Thus, the electrical resistance of the magnetic tunnel junction MTJ may be controlled by changing the magnetization direction of the free layer. The memory element ME may store logical data by means of a difference between the electrical resistances of the magnetic tunnel junction MTJ. The magnetization direction of the free layer may be changed by spin torque of electrons included in a program current.

In some embodiments, the magnetization directions of the first and second magnetic patterns MS1 and MS2 may be substantially parallel to a top surface of a substrate (or a top surface of the tunnel barrier TBR), as illustrated in FIG. 3A. In this case, each of the first and second magnetic patterns MS1 and MS2 may include a ferromagnetic material. The first magnetic patterns MS1 corresponding to the pinned layer may further include an anti-ferromagnetic material pinning the magnetization direction of the ferromagnetic material. For example, each of the first and second magnetic patterns MS1 and MS2 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). Here, the pinned layer may be thicker than the free layer and/or a coercive force of the pinned layer may be greater than that of the free layer. The tunnel barrier TBR may include at least one of magnesium oxide, titanium oxide, aluminum oxide, magnesium-zinc oxide, and/or magnesium-boron oxide.

In other embodiments, the magnetization directions of the first and second magnetic patterns MS1 and MS2 may be substantially perpendicular to the top surface of the substrate (or the top surface of the tunnel barrier TBR), as illustrated in FIG. 3B. In this case, each of the first and second magnetic patterns MS1 and MS2 may include at least one of a perpendicular magnetic material (e.g., CoFeTb, CoFeGd, CoFeDy, and/or CoTb), a perpendicular magnetic material having a $L1_0$ structure, CoPt having a hexagonal close packed (HCP) lattice structure, and/or a perpendicular magnetic structure. The perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n (where "n" denotes the number of bilayers). Here, the pinned layer may be thicker than the free layer, and/or a coercive force of the pinned layer may be greater than a coercive force of the free layer. The tunnel barrier TBR may include at least one of, for example, magnesium oxide, titanium oxide, aluminum oxide, magnesium-zinc oxide, and/or magnesium-boron oxide.

Figure 4:
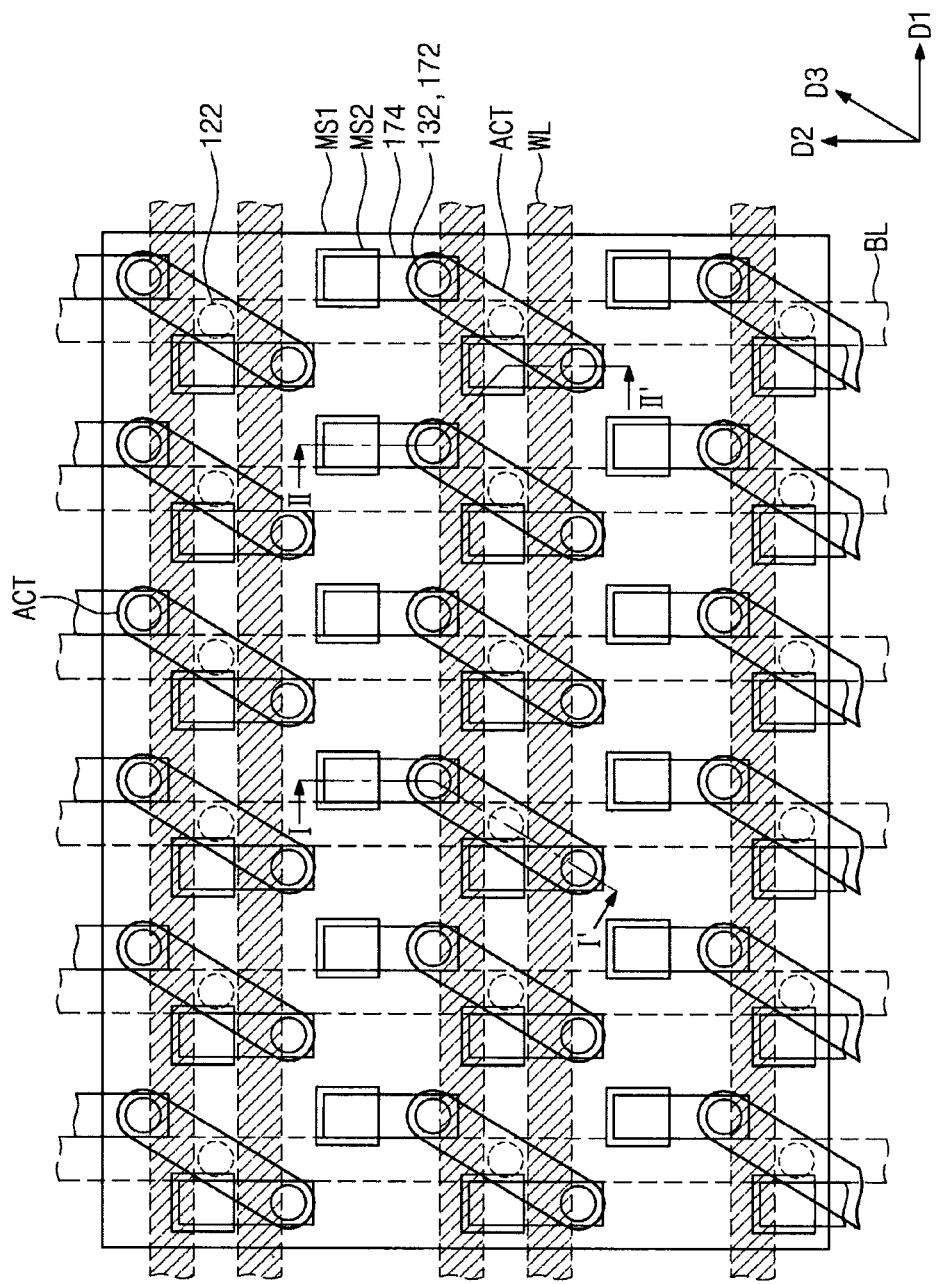
FIG. 4 is a plan view illustrating a magnetic memory device according to some embodiments of the inventive concepts.
Figure 5A:
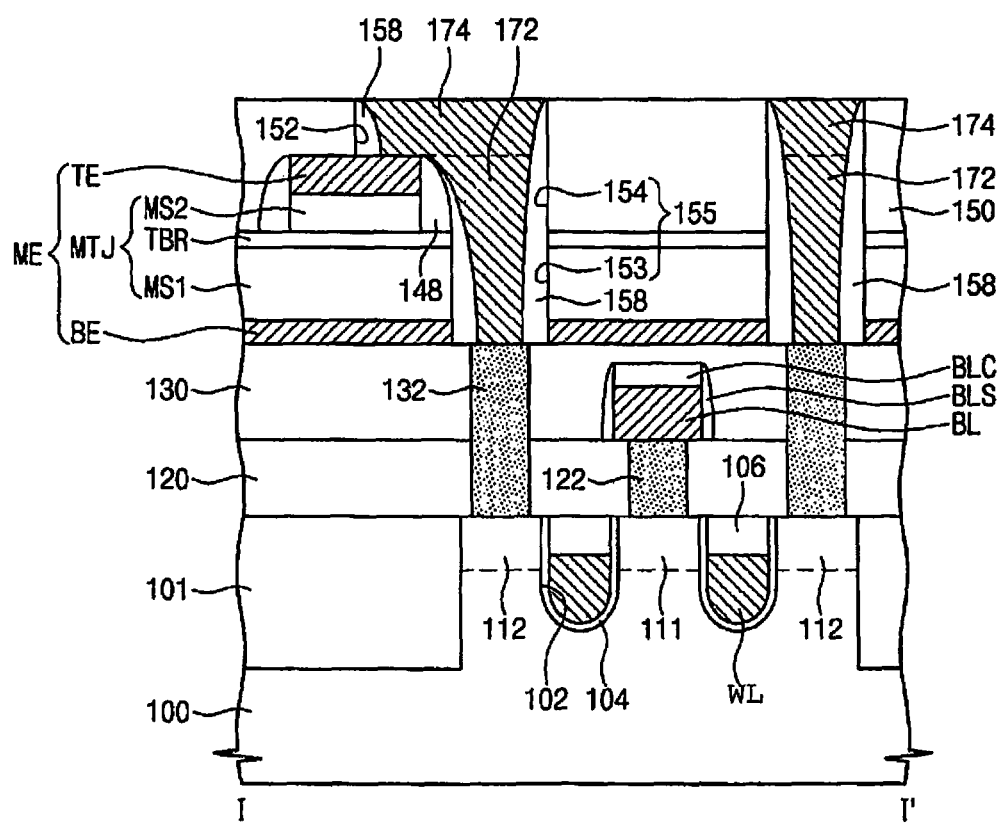
FIGS. 5A and 5B are cross-sectional views taken along lines I-I' and II'-II' of FIG. 4, respectively.
Figure 5B:
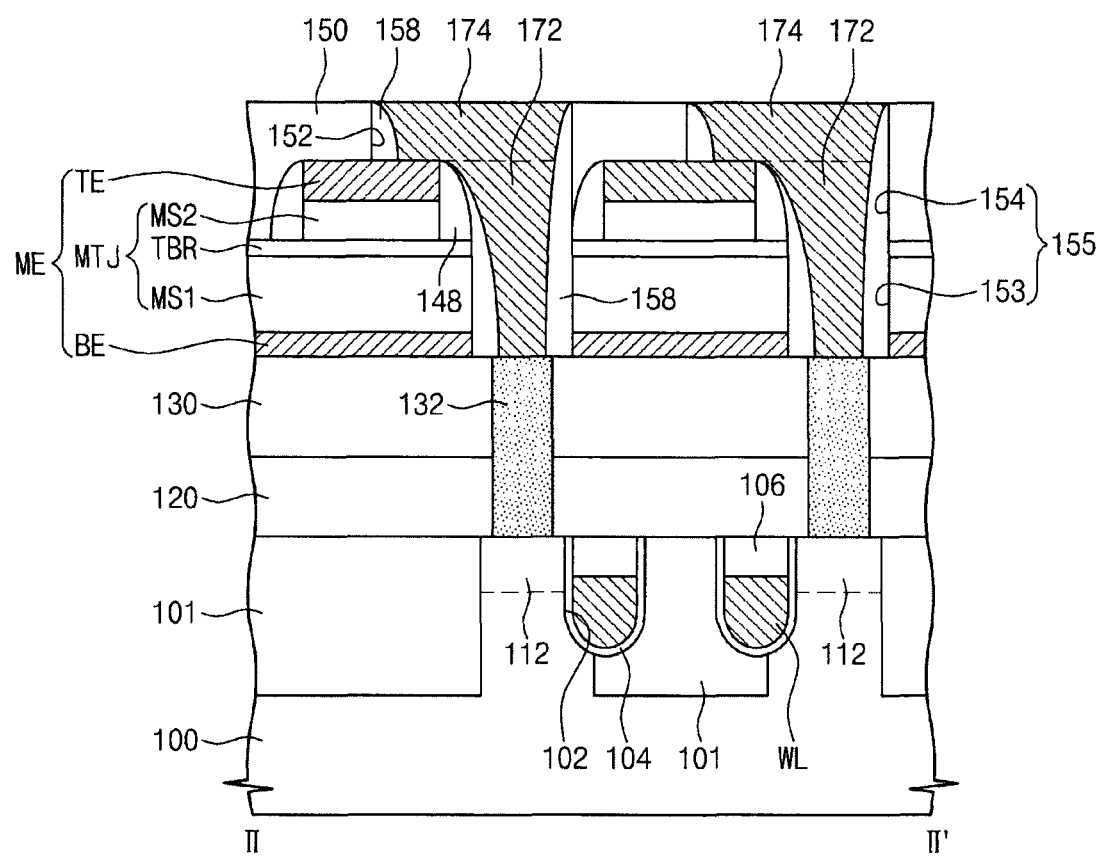

FIG. 4 is a plan view illustrating a magnetic memory device according to some embodiments of the inventive concepts. FIGS. 5A and 5B are cross-sectional views taken along lines I-I' and II-II' of FIG. 4, respectively.

Referring to FIGS. 4, 5A, and 5B, a device isolation layer 101 may be formed in a substrate 100 to define active regions ACT. The substrate 100 may be a silicon substrate, a germanium substrate, or a silicon-germanium substrate.

The active regions ACT may be two-dimensionally arranged along a plurality of rows and a plurality of columns. Each of the active regions ACT may have a rectangular shape (or a bar shape) that extends in a diagonal direction D3 with respect to first and second directions D1 and D2 perpendicular to each other. The active regions ACT arranged in the first direction D1 may constitute each of the rows, and the active regions ACT arranged in the second direction D2 may constitute each of the columns. The active regions ACT may be doped with dopants having a first conductivity type.

At least one gate recess region 102 may intersect the active regions ACT constituting each of the rows. The gate recess region 102 may have a groove shape extending in the first direction D1. A depth of the gate recess region 102 may be smaller than a depth of the device isolation layer 101. In some embodiments, a pair of gate recess regions 102 may intersect the active regions ACT constituting each of the rows. A word line WL may be disposed in each of the gate recess regions 102, and a gate dielectric layer 104 may be disposed between the word line WL and an inner surface of the gate recess region 102. The word line WL may have a line shape extending in the first direction D1.

A gate capping pattern 106 may be disposed on the word line WL. A top surface of the gate capping pattern 106 may be substantially coplanar with a top surface of the substrate 100.

For example, the word line WL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide).

The gate dielectric layer 104 may include at least one of an oxide (e.g., silicon oxide), a nitride (e.g., silicon nitride), an oxynitride (e.g., silicon oxynitride), and/or a high-k dielectric material (e.g., an insulating metal oxide such as hafnium oxide or aluminum oxide). The gate capping pattern 106 may include at least one of an oxide (e.g., silicon oxide), a nitride (e.g., silicon nitride), and/or an oxynitride (e.g., silicon oxynitride).

A first dopant region 111 may be disposed in each of the active regions ACT between the pair of word lines WL. A pair of second dopant regions 112 may be respectively disposed in both edge regions of each of the active regions ACT at both sides of the pair of word lines WL. Thus, the pair of cell transistor and may at each of the active regions ACT and may share the first dopant region 111. The cell transistors may function as the selection elements SE of FIG. 2. Each of the cell transistors may include the word line WL, the gate dielectric layer 104 and the first and second dopant regions 111 and 112. The cell transistors may include a recessed channel region due to the word line formed in the gate recess region 102.

The first dopant region 111 and the second dopant region 112 may correspond to a drain region and a source region of the cell transistor, respectively. The first and second dopant regions 111 and 112 may be doped with dopants of which a second conductivity type is different from the first conductivity type of the active region ACT. One of the first and second conductivity types may be an N-type, and the other of the first and second conductivity types may be a P-type.

A first interlayer insulating layer 120 may be disposed on the substrate 100. The first interlayer insulating layer 120 may be formed of, for example, silicon oxide. First contact plugs 122 may be disposed in the first interlayer insulating layer 120 so as to be connected to the first dopant regions 111, respectively. For example, the first contact plugs 122 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). Top surfaces of the first contact plugs 122 may be substantially coplanar with a top surface of the first interlayer insulating layer 120.

A bit line BL may be disposed on the first interlayer insulating layer 120. The bit line BL may be connected in common to a plurality of the first contact plugs 122 and may extend in the second direction D2. The bit line BL may be provided in plurality on the first interlayer insulating layer 120. A bit line capping pattern BLC and a bit line spacer BLS may be disposed on a top surface and sidewalls of the bit line BL, respectively. For example, the bit line capping pattern BLC and the bit line spacer BLS may be formed of silicon nitride or silicon oxide.

A second interlayer insulating layer 130 may be disposed on the first interlayer insulating layer 120 to cover the bit line BL. For example, the second interlayer insulating layer 130 may be formed of silicon oxide.

Second contact plugs 132 may sequentially penetrate the second and first interlayer insulating layers 130 and 120. For example, the second contact plugs 132 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). The second contact plugs 132 may be electrically connected to the second dopant regions 112, respectively. In an embodiment, ohmic patterns (not shown) may be disposed between the first contact plugs 122 and the first dopant regions 111 and may be disposed between the second contact plugs 132 and the second dopant regions 112, respectively. The ohmic patterns may include a metal-semiconductor compound (e.g., a metal silicide such as cobalt silicide or titanium silicide).

Memory elements ME may be disposed on the second interlayer insulating layer 130. Each of the memory elements ME may include a bottom electrode BE, a magnetic tunnel junction MTJ, and a top electrode TE. The magnetic tunnel junction MTJ may include a first magnetic pattern MS1, a second magnetic pattern MS2, and a tunnel barrier TBR disposed between the first and second magnetic patterns MS1 and MS2.

In some embodiments, the first magnetic pattern MS1 may be provided in one united body on the second interlayer insulating layer 130. In other words, the first magnetic pattern MS1 may have a plate shape. The first magnetic pattern MS1 may have a plurality of first through-holes 153 exposing the second contact plugs 132. The first through-holes 153 may vertically overlap with the second contact plugs 132, respectively.

The second magnetic patterns MS2 may be disposed on the first magnetic pattern MS1 spaced apart from each other. The second magnetic patterns MS2 may have island shapes. A plurality of second magnetic patterns MS2 adjacent to each other may be spaced apart from each other at equal distances. As illustrated in FIG. 4, the plurality of second magnetic patterns MS2 adjacent to each other may constitute an equilateral triangle. In other words, the plurality of second magnetic patterns MS2 adjacent to each other may be disposed at vertexes of the equilateral triangle, respectively.

The second magnetic patterns MS2 may be offset from the first through-holes 153. The second magnetic patterns MS2 may not vertically overlap with the second contact plugs 132. Each of the first through-holes 153 may be spaced apart by the same distance from the plurality of second magnetic patterns MS2 adjacent to each other.

For example, each of the first through-holes 153 may be disposed at a center of the equilateral triangle of the plurality of second magnetic patterns MS2.

The tunnel barrier TBR may be disposed between the first magnetic pattern MS1 and the second magnetic patterns MS2. The tunnel barrier TBR may extend onto the first magnetic pattern MS1. The first through-holes 153 may also penetrate the tunnel barrier TBR.

The first magnetic pattern MS1 may have a fixed magnetization direction, and the second magnetic patterns MS2 may have changeable magnetization directions. The first magnetic pattern MS1, the second magnetic patterns, and the tunnel barrier TBR may include the same materials described with reference to FIG. 3A or 3B.

In addition, the bottom electrode BE may be disposed between the first magnetic pattern MS1 and the second interlayer insulating layer 130. The bottom electrode BE may have the same planar shape as the first magnetic pattern MS1. The bottom electrode BE may include at least one of a conductive metal nitride (e.g., titanium nitride or tantalum nitride), a transition metal (e.g., titanium or tantalum), and/or a rare-earth metal (e.g., ruthenium or platinum).

The top electrodes TE may be disposed on the second magnetic patterns MS2, respectively. The top electrodes TE may include at least one of a conductive metal nitride (e.g., titanium nitride or tantalum nitride), a transition metal (e.g., titanium or tantalum), and/or a rare-earth metal (e.g., ruthenium or platinum). Sidewalls of the second magnetic patterns MS2 may be self-aligned with sidewalls of the top electrodes TE, respectively.

First spacers 148 may be disposed on the sidewalls of the second magnetic patterns MS2 and top electrodes TE. The first spacers 148 may include a different material from the interlayer insulating layers 120, 130, and 150. The first spacers 148 may have an etch selectivity with respect to the interlayer insulating layers 120, 130, and 150. For example, the first spacers 148 may include silicon nitride or silicon oxynitride. Sidewalls of the first through-holes 153 may be self-aligned with sidewalls of the first spacers 148, respectively.

A third interlayer insulating layer 150 may be provided on the first magnetic pattern MS1 to fill a space between the second magnetic patterns MS2. A top surface of the third interlayer insulating layer 150 may be higher than top surfaces of the top electrodes TE. Each of the first to third interlayer insulating layers 120, 130, and 150 may be formed of at least one of an oxide (e.g., silicon oxide), a nitride (e.g., silicon nitride), or an oxynitride (e.g., silicon oxynitride).

Second through-holes 154 may be formed in a lower portion of the third interlayer insulating layer 150 and may be connected to the first through-holes 153, respectively. Sidewalls of the second through-holes 154 may be coplanar with sidewalls of the first through-holes 153, respectively. The first through-hole 153 and the second through-hole 154 which are connected to each other may constitute a through-hole 155. In other words, the through-holes 155 may include the first through-holes 153 and the second through-holes 154. Sidewalls of the through-holes 155 may be self-aligned with the sidewalls of the first spacers 148. Grooves 152 may be formed in an upper portion of the third interlayer insulating layer 150 to expose the top electrodes TE and the through-holes 155. Each of the grooves 152 may extend from each of the through-holes 155 along the second direction D2. The grooves 152 may be connected to the through-holes 155.

Second spacers 158 may be formed on sidewalls of the grooves 152 and through-holes 155. The second spacers 158 may be insulating spacers. The second spacers 158 may include silicon oxide. The second spacers 158 may extend onto the first spacers 148.

Third contact plugs 172 may be provided in the through-holes 155, respectively, and connection pads 174 may be provided in the grooves 152, respectively. The third contact plugs 172 and the connection pads 174 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). The third contact plug 172 and the connection pad 174, which are connected to each other, may be formed in one united body.

The connection pads 174 may be in contact with the top surfaces of the upper electrodes TE, respectively. The third contact plugs 172 may penetrate the first magnetic pattern MS1 and be connected to the second contact plugs 132, respectively. The third contact plugs 172 may be electrically insulated from the first magnetic pattern MS1 by the second spacers 158.

FIGS. 6A to 13A are cross-sectional views corresponding to the line I-I' of FIG. 4 to illustrate a method of manufacturing a magnetic memory device according to some embodiments of the inventive concepts. FIGS. 6B to 13B are cross-sectional views corresponding to the line II-II' of FIG. 4 to illustrate a method of manufacturing a magnetic memory device according to some embodiments of the inventive concepts.

Figure 6A:
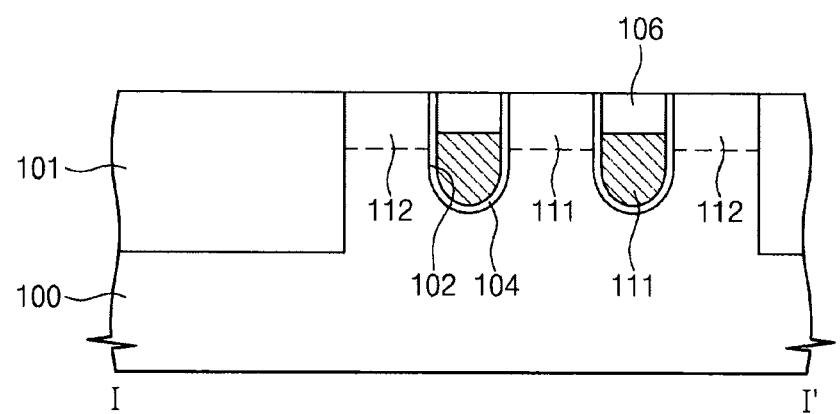
Figure 6B:
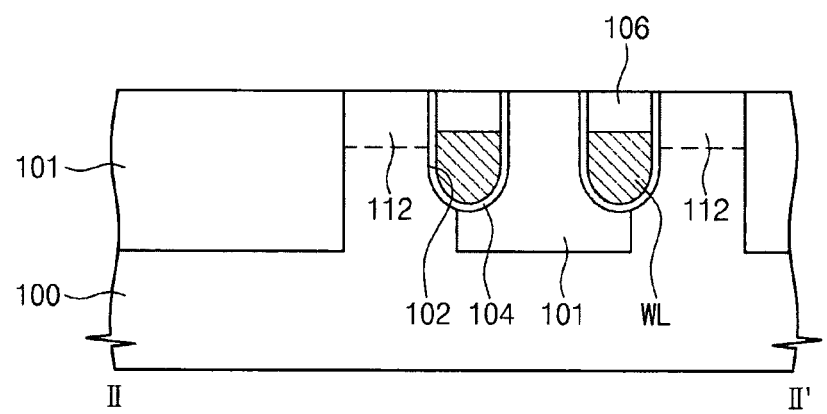

Referring to FIGS. 4, 6A, and 6B, a substrate 100 is prepared. The substrate 100 may be a silicon substrate, a germanium substrate, or a silicon-germanium substrate. The substrate 100 may have a first conductivity type.

A device isolation layer 101 may be formed in the substrate 100 to define active regions ACT. The active regions ACT may be doped with dopants having the first conductivity type. Each of the active regions ACT may have a rectangular shape (or a bar shape) extending in the diagonal direction D3 of FIG. 4. The active regions ACT may be arranged in the first direction D1 to constitute each row and may be arranged in the second direction D2 to constitute each column. The device isolation layer 101 may be formed by shallow trench isolation (STI) technique.

The active regions ACT and the device isolation layer 101 may be patterned to form gate recess regions 102 that extend in parallel to each other along the first direction D1 of FIG. 4. A pair of gate recess regions 102 may intersect one active region ACT. Depths of the gate recess regions 102 may be smaller than a depth of the device isolation layer 101.

A gate dielectric layer 104 may be formed with a substantially uniform thickness on inner surfaces of the gate recess regions 102. The gate dielectric layer 104 may be a silicon oxide layer that is formed by thermally oxidizing the substrate 100. Alternatively, the gate dielectric layer 104 may include at least one of silicon oxide, silicon nitride, silicon oxynitride, and/or a high-k dielectric material (e.g., an insulating metal oxide such as hafnium oxide or aluminum oxide).

Subsequently, a first conductive layer may be formed to fill the gate recess regions 102. The first conductive layer may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). The first conductive layer may be etched to form a word line WL in each of the gate recess regions 102. Top surfaces of the word lines WL may be recessed to be lower than a top surface of the substrate 100.

Gate capping patterns 106 may be formed to fill the gate recess regions 102 on the word lines WL. The gate capping patterns 106 may include at least one of silicon oxide, silicon nitride, and/or silicon oxynitride.

Dopants having a second conductivity type different from the first conductivity type may be implanted into the active regions ACT at both sides of each of the word lines WL to form first dopant regions 111 and second dopant regions 112. One of the dopants having the first and the second conductivity types may be an N-type dopant, and the other of the dopants having the first and second conductivity types may be a P-type dopant. Bottom ends of the first and second dopant regions 111 and 112 may be higher than bottom ends of the word lines WL.

Figure 7A:
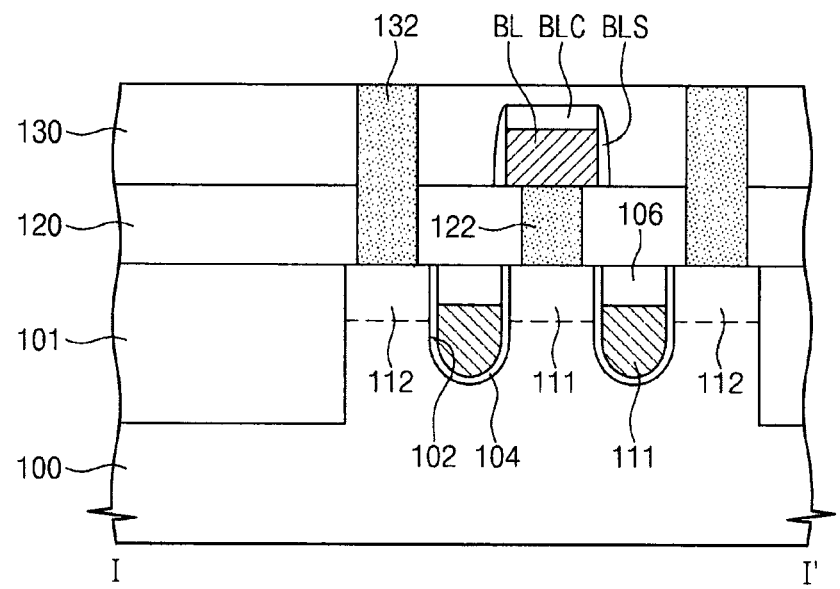
Figure 7B:
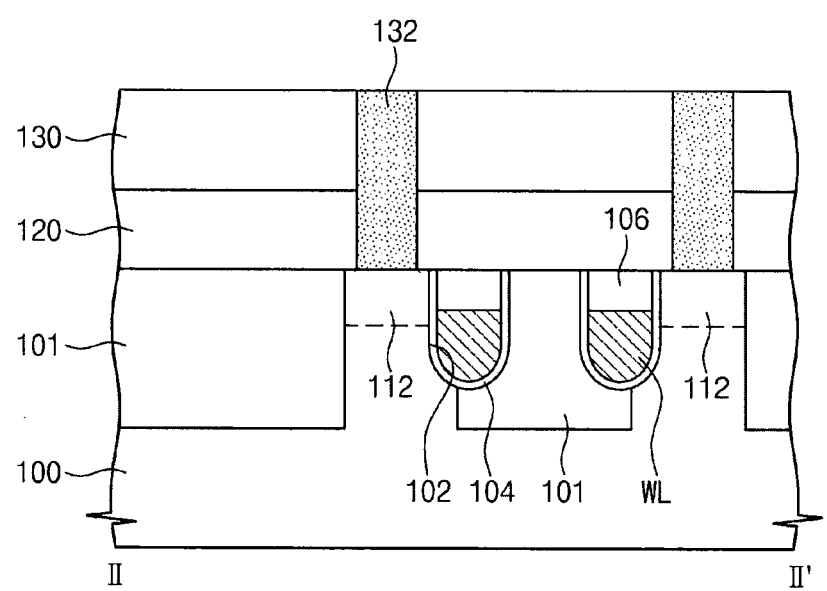

Referring to FIGS. 4, 7A, and 7B, a first interlayer insulating layer 120 may be formed on the substrate 100. The first interlayer insulating layer 120 may be formed of, for example, silicon oxide. The first interlayer insulating layer 120 may be patterned to form first contact holes that expose the first dopant regions 111, respectively.

A second conductive layer may be formed to fill the first contact holes. The second conductive layer may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). The second conductive layer may be planarized until the first interlayer insulating layer 120 is exposed, so first contact plugs 122 may be formed in the first contact holes, respectively. The second contact plugs 122 may be connected to the first dopant regions 111, respectively. In an embodiment, an ohmic pattern (not shown) may be formed between each of the first contact plugs 122 and each of the first dopant regions 111. The ohmic pattern may include a metal-semiconductor compound (e.g., a metal silicide such as cobalt silicide or titanium silicide).

A bit line BL may be formed on the first interlayer insulating layer 120. The bit line BL may be connected in common to a plurality of the first contact plugs 122 and may extend in the second direction D2. The bit line BL may be provided in plurality on the first interlayer insulating layer 120. The bit line BL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). A bit line capping pattern and a bit line spacer BLS may be formed on a top surface and sidewalls of the bit line BL, respectively. For example, the bit line capping pattern BLC and the bit line spacer BLS may be formed of silicon nitride or silicon oxide.

A second interlayer insulating layer 130 may be formed on the first interlayer insulating layer 120. For example, the second interlayer insulating layer 130 may be formed of silicon oxide. Second contact plugs 132 may be formed to sequentially penetrate the second and first interlayer insulating layers 130 and 120. The second contact plugs 132 may be formed by a method similar to the method of forming the first contact plugs 122. The second contact plugs 132 may be formed of the same material as the first contact plugs 122. The second contact plugs 132 may be electrically connected to the second dopant regions 112, respectively. In an embodiment, an ohmic pattern (not shown) may be formed between each of the second contact plugs 132 and each of the second dopant regions 112. The ohmic pattern may include a metal-semiconductor compound (e.g., a metal silicide such as cobalt silicide or titanium silicide).

The second interlayer insulating layer 130 may have a top surface that is substantially parallel to a main surface (e.g., the top surface) of the substrate 100.

Figure 8A:
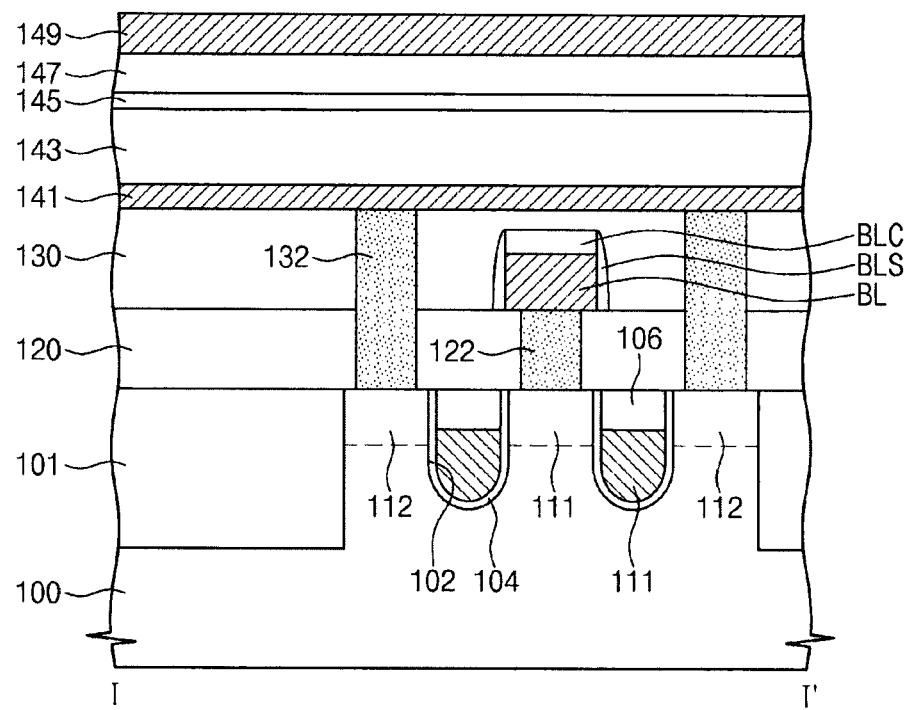
Figure 8B:
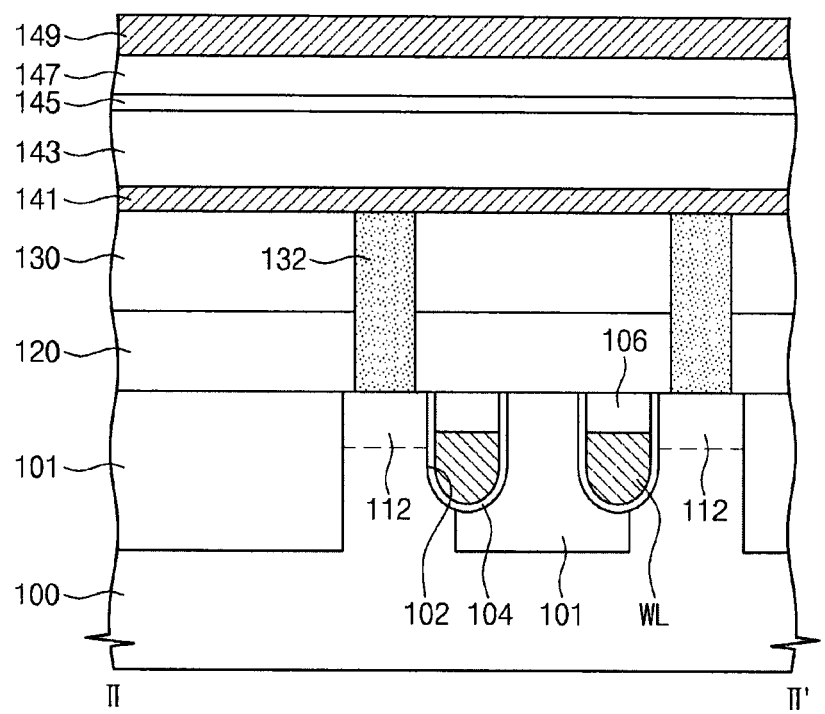

Referring to FIGS. 4, 8A, and 8B, a bottom electrode layer 141, a first magnetic layer 143, a tunnel barrier layer 145, a second magnetic layer 147, and a top electrode layer 149 may be sequentially formed on the second interlayer insulating layer 130. The first magnetic layer 143 may be thicker than the second magnetic layer 147. Since the second interlayer insulating layer 130 has a flat top surface, the first magnetic layer 143, the tunnel barrier layer 145, and the second magnetic layer 147 may be formed with high quality. Thus, characteristics of a magnetic tunnel junction MTJ to be formed later may be more improved.

The bottom electrode layer 141 may include at least one of a conductive metal nitride (e.g., titanium nitride or tantalum nitride), a transition metal (e.g., titanium or tantalum), and/or a rare-earth metal (e.g., ruthenium or platinum).

The first magnetic layer 143 may have a magnetization direction parallel to the top surface of the substrate 100. In this case, the first magnetic layer 143 may include at least one of iron (Fe) and cobalt (Co). For example, the first magnetic layer 143 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). Alternatively, the magnetization direction of the first magnetic layer 143 may be substantially perpendicular to the top surface of the substrate 100. In this case, the first magnetic layer 143 may include at least one of a perpendicular magnetic material (e.g., CoFeTb, CoFeGd, CoFeDy, CoTb), a perpendicular magnetic material having a $L1_0$ structure, CoPt having a hexagonal close packed (HCP) lattice structure, and/or a multi-thin layer (e.g., Co/Pt or Co/Pd). The perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure. The first magnetic layer 143 may further include an exchange coupling layer (not shown) inserted therein. The exchange coupling layer may include at least one of non-magnetic transition metal elements. For example, the exchange coupling layer may include at least one of magnesium (Mg), aluminum (Al), titanium (Ti), chrome (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and/or hafnium (Hf).

The tunnel barrier layer 145 may include at least one of magnesium oxide, titanium oxide, aluminum oxide, magnesium-zinc oxide, and/or magnesium-boron oxide.

The second magnetic layer 147 may have a magnetization direction parallel to the top surface of the substrate 100. In this case, the second magnetic layer 147 may include at least one of iron (Fe) and cobalt (Co). For example, the second magnetic layer 147 may include at least one of cobalt-iron-boron (CoFeB), iron-boron (FeB), cobalt-iron (CoFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). Alternatively, the magnetization direction of the second magnetic layer 147 may be substantially perpendicular to the top surface of the substrate 100. In this case, the second magnetic layer 147 may include at least one of a perpendicular magnetic material (e.g., CoFeTb, CoFeGd, CoFeDy, or CoTb), a perpendicular magnetic material having a $L1_0$ structure, CoPt having a hexagonal close packed (HCP) lattice structure, and/or a multi-thin layer (e.g., Co/Pt or Co/Pd). Here, the perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure.

Here, the first magnetic layer 143 may be thicker than the second magnetic layer 147, and/or a coercive force of the first magnetic layer 143 may be greater than a coercive force of the second magnetic layer 147.

The top electrode layer 149 may include at least one of a conductive metal nitride (e.g., titanium nitride or tantalum nitride), a transition metal (e.g., titanium or tantalum), and/or a rare-earth metal (e.g., ruthenium or platinum).

Figure 9A:
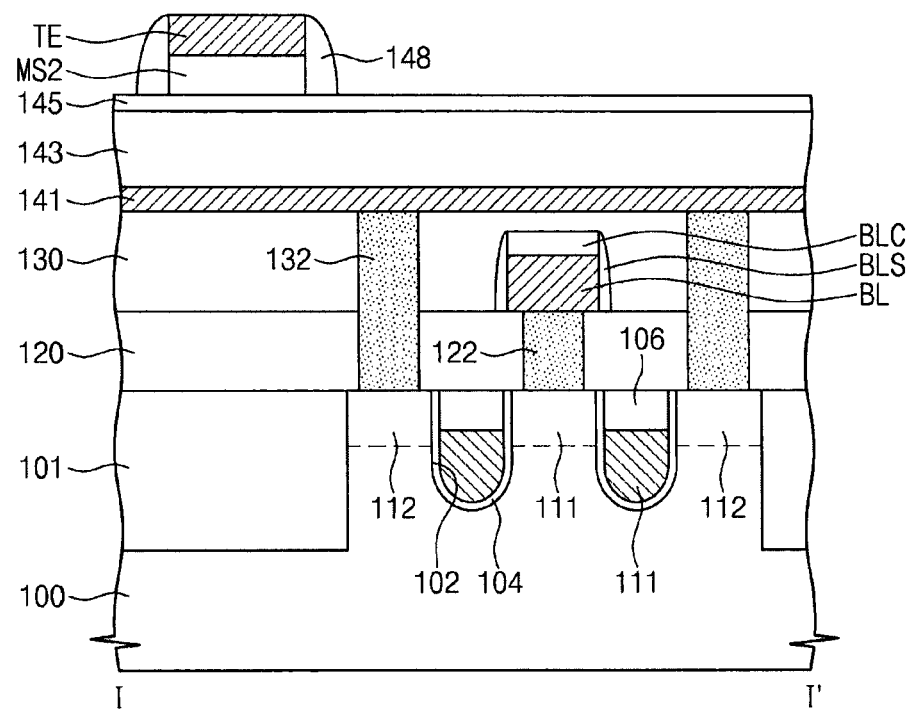
Figure 9B:
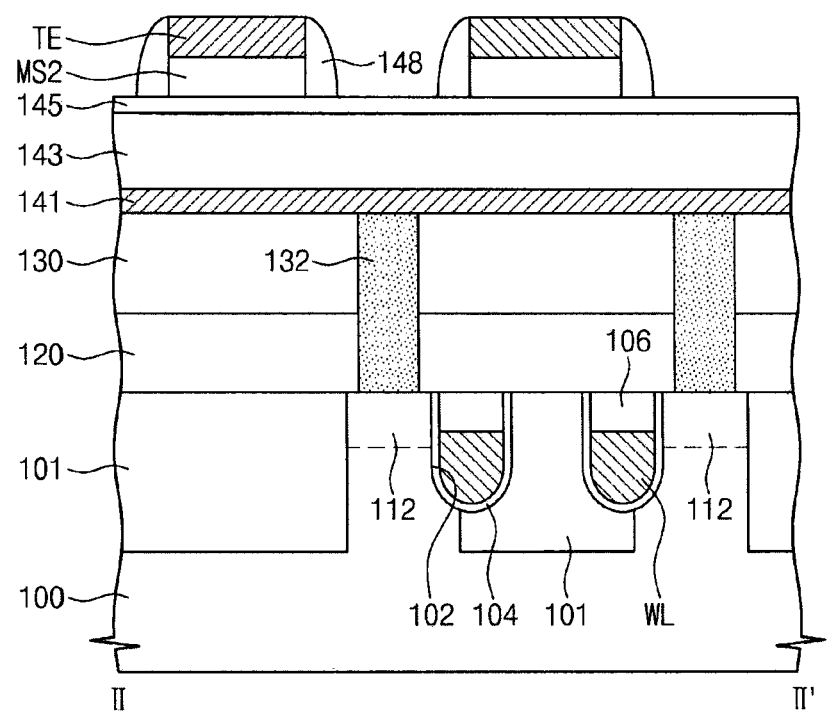

Referring to FIGS. 4, 9A, and 9B, the top electrode layer 149 and the second magnetic layer 147 may be patterned to form top electrodes TE and second magnetic patterns MS2.

A plurality of second magnetic patterns MS2 adjacent to each other may be spaced apart from each other at equal distances. As illustrated in FIG. 4, the plurality of second magnetic patterns MS2 adjacent to each other may constitute an equilateral triangle. In other words, the plurality of second magnetic patterns MS2 adjacent to each other may correspond to vertexes of the equilateral triangle, respectively. The second magnetic patterns MS2 may be laterally offset from the second contact plugs 132. In other words, the second magnetic patterns MS2 may not vertically overlap with the second contact plugs 132. Each of the first through-holes 153 may be laterally spaced apart by the same distance from the plurality of second magnetic patterns MS2 adjacent to each other.

First spacers 148 may be formed on sidewalls of the second magnetic patterns MS2 and top electrodes TE. For example, the first spacers 148 may include silicon nitride or silicon oxynitride.

Figure 10A:
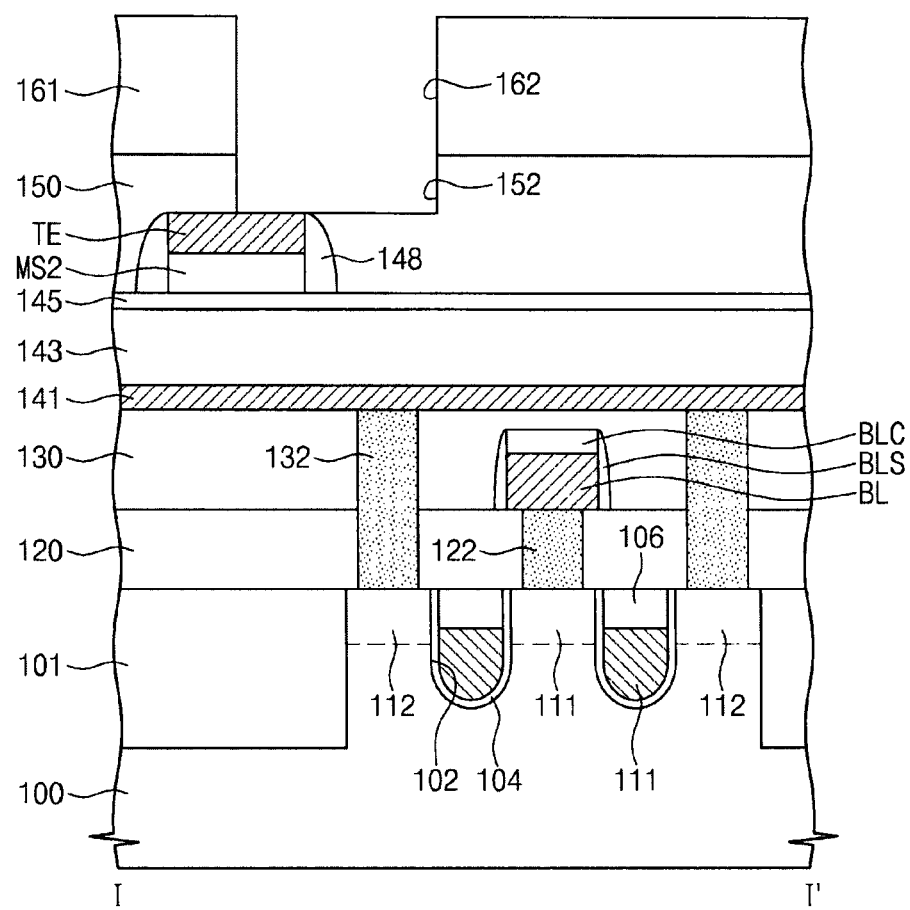
Figure 10B:
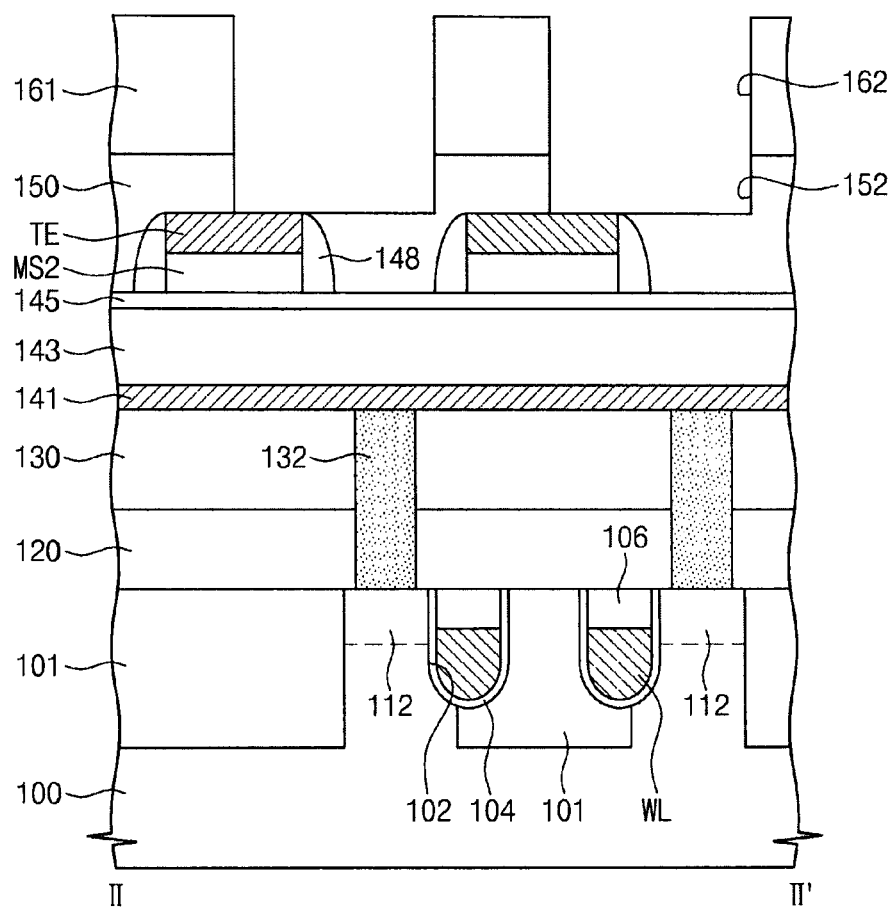

Referring to FIGS. 4, 10A, and 10B, a third interlayer insulating layer 150 may be formed to fill a space between the second magnetic patterns MS2. The third interlayer insulating layer 150 may cover the top electrodes TE. The third interlayer insulating layer 150 may be formed of at least one of an oxide (e.g., silicon oxide), a nitride (e.g., silicon nitride), or an oxynitride (e.g., silicon oxynitride).

A first mask pattern 161 may be formed on the third interlayer insulating layer 150. The first mask pattern 161 may be a photoresist pattern. The first mask pattern 161 may have first openings 162 of which each vertically overlaps with each of the top electrodes TE and each of the second contact plugs 132. The first opening 162 may laterally extend from the second contact plug 132 toward the top electrode TE.

The third interlayer insulating layer 150 may be etched by a patterning process using the first mask pattern 161 as an etching mask to form grooves 152. The grooves 152 may be formed in an upper portion of the third interlayer insulating layer 150 to expose top surfaces of the top electrodes TE, respectively.

Figure 11A:
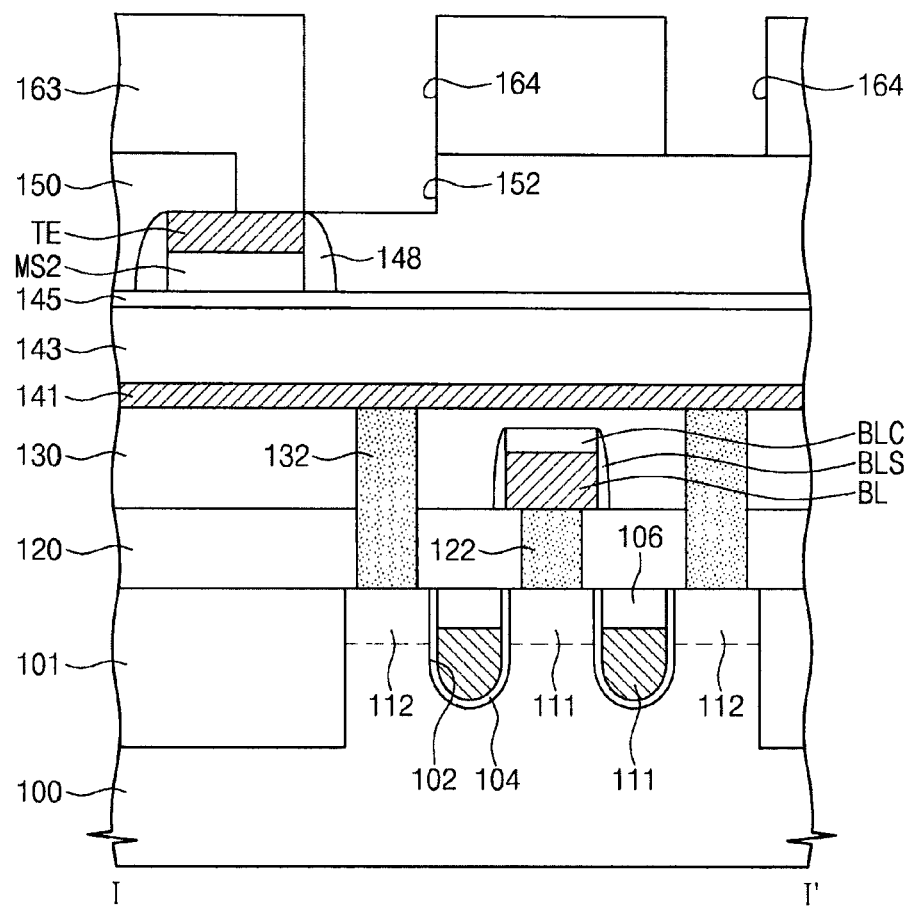
Figure 11B:
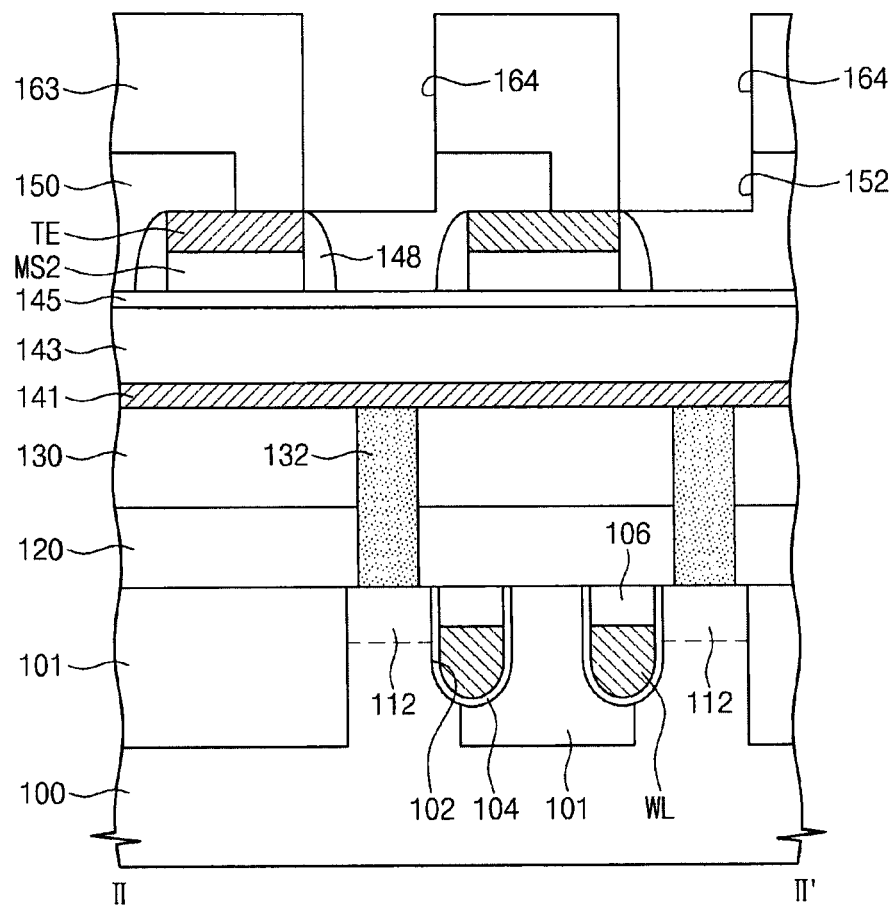

Referring to FIGS. 4, 11A, and 11B, the first mask pattern 161 may be removed. Subsequently, a second mask pattern 163 may be formed to have second openings 164 that vertically overlap with the second contact plugs 132, respectively. The second mask pattern 163 may be a photoresist pattern.

Figure 12A:
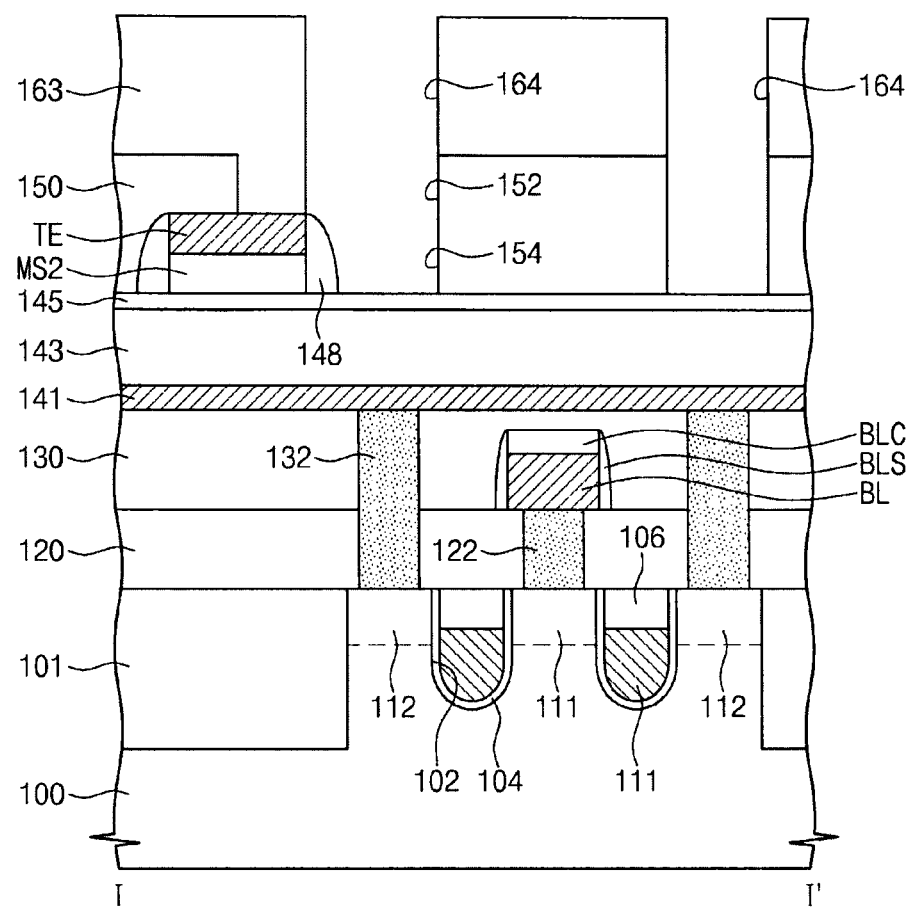
Figure 12B:
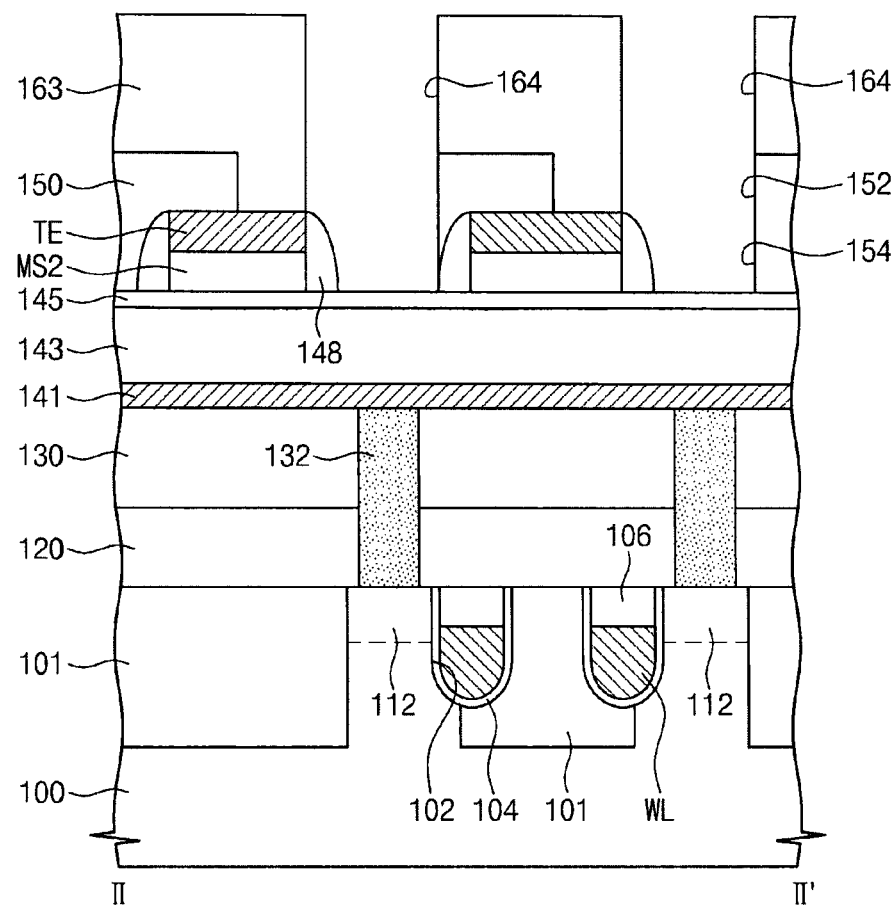

Referring to FIGS. 4, 12A, and 12B, the third interlayer insulating layer 150 may be etched by a patterning process using the second mask pattern 163 as an etching mask to form second through-holes 154. The second through-holes 154 may expose the tunnel barrier layer 145 or the first magnetic layer 143.

Figure 13A:
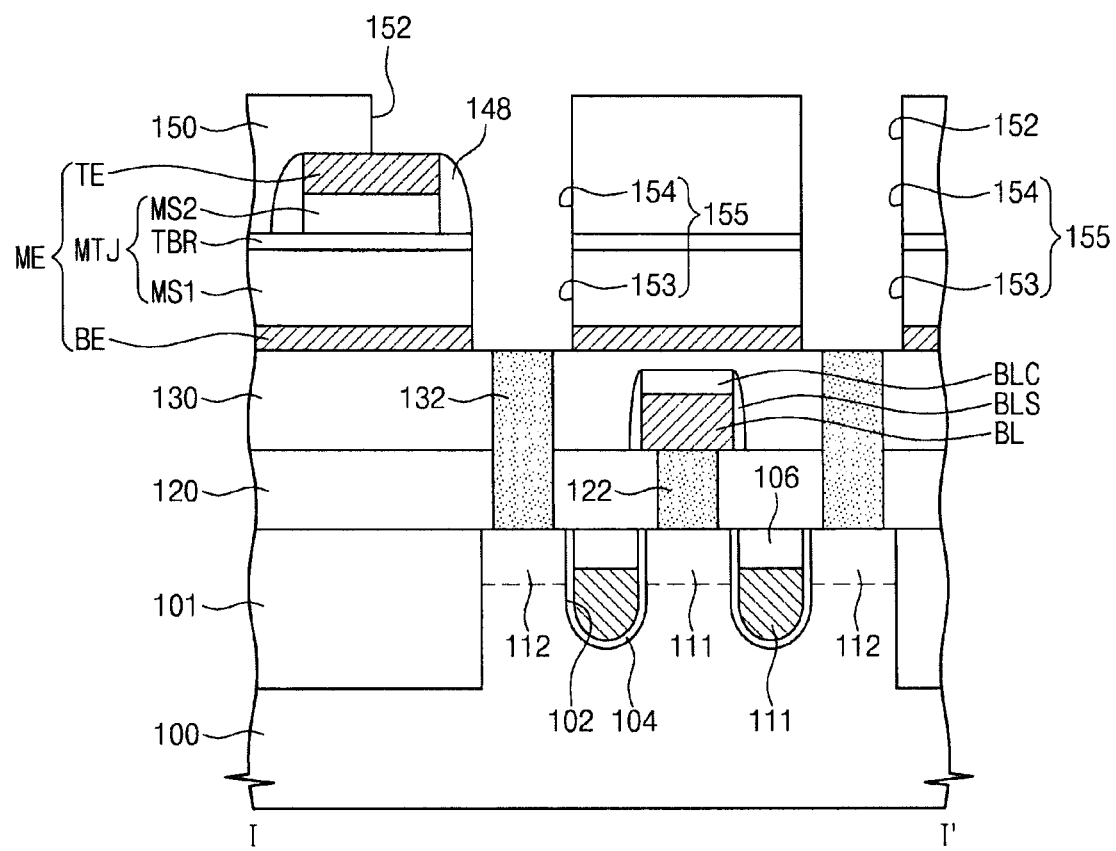
Figure 13B:
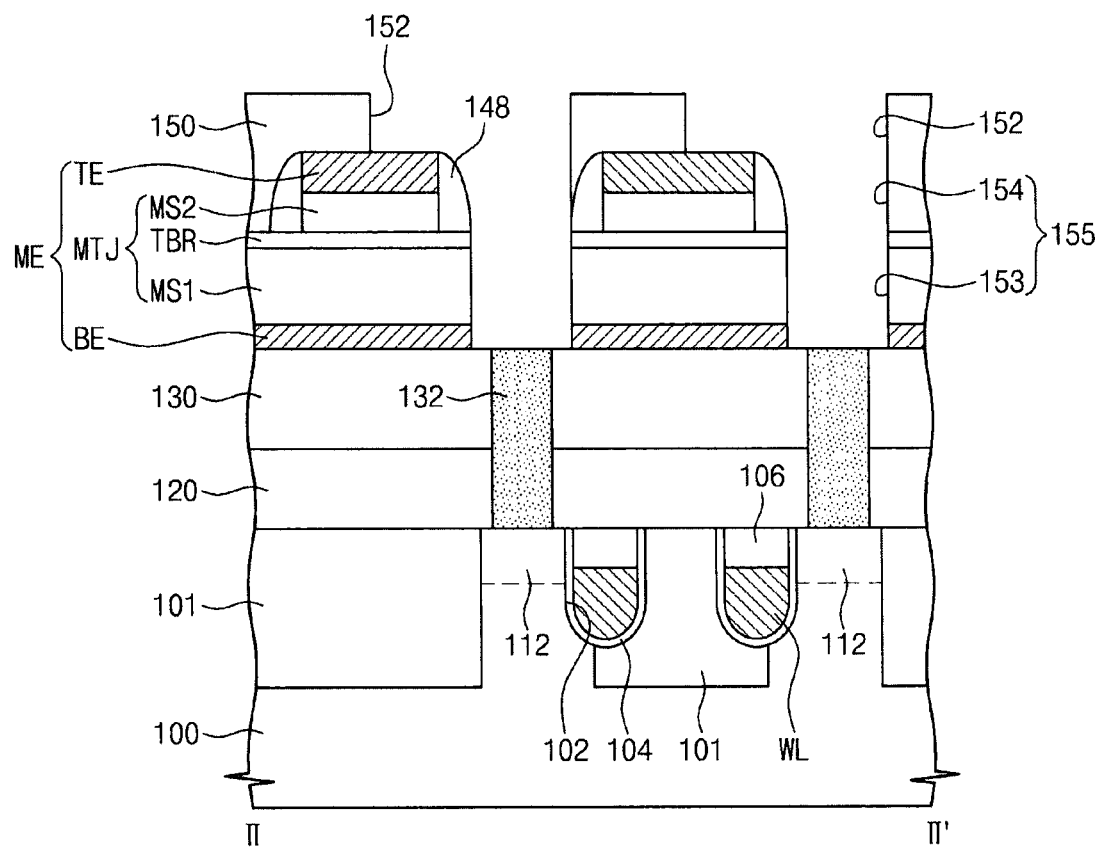

Referring to FIGS. 4, 13A, and 13B, an additional patterning process using the second mask pattern 163 may be performed to etch the tunnel barrier layer 145, the first magnetic layer 143, and the bottom electrode layer 141. Thus, a tunnel barrier TBR, a first magnetic pattern MS1, and a bottom electrode BE may be formed. A physical etching process (e.g., a sputter etching or ion beam etching may be used to etch the first magnetic layer 143. As a result, first through-holes 153 may be formed. Each of the first through-holes 153 may be connected to each of the second through-holes 154. Each of the first through-holes 153 and the each of the second through-holes 154 connected thereto may be self-aligned with each other. The first through-holes 153 may expose the second contact plugs 132, respectively. The first and second through-holes 153 and 154 connected to each other may constitute a through-hole 155. In the etching process of the first magnetic layer 143, the first through-holes 153 may be self-aligned with the first spacers 148. This is because the first spacers 148 are formed of a material having an etch selectivity with respect to the third interlayer insulating layer 150. In addition, the first spacers 148 may prevent the magnetic tunnel junction MTJ from being damaged during the etching process of the first magnetic layer 143. Furthermore, the first spacers 148 may prevent by-products generated by the etching process of the first magnetic layer 143 from being formed on the second magnetic patterns MS2. Next, the second mask pattern 163 may be removed.

Referring again to FIGS. 4, 5A, and 5B, second spacers 158 may be formed on sidewalls of the through-holes 155 and grooves 152. The second spacers 158 may include a silicon oxide layer. The second spacers 158 may extend onto the first spacers 148.

A third conductive layer may be formed to fill the through-holes 155 and the grooves 152. The third conductive layer may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide). The third conductive layer may be planarized until the third interlayer insulating layer 150 is exposed, so third contact plugs 172 may be formed in the through-holes 155 and connection pads 174 may be formed in the grooves 152.

The third contact plugs 172 may be connected to the second contact plugs 132, respectively. In an embodiment, an ohmic pattern (not shown) may be formed between the third contact plug 172 and the second contact plug 132. The ohmic pattern may include a metal-semiconductor compound (e.g., a metal silicide such as cobalt silicide or titanium silicide). The third contact plug 172 and the connection pad 174 connected to each other may be formed in one united body. The connection pads 174 may be in contact with the top surfaces of the top electrodes TE, respectively. The third contact plugs 172 may penetrate the first magnetic pattern MS1 so as to be connected to the second contact plugs 132, respectively. The third contact plugs 172 may be electrically insulated from the first magnetic pattern MS1 by the second spacers 158.

Figure 14:
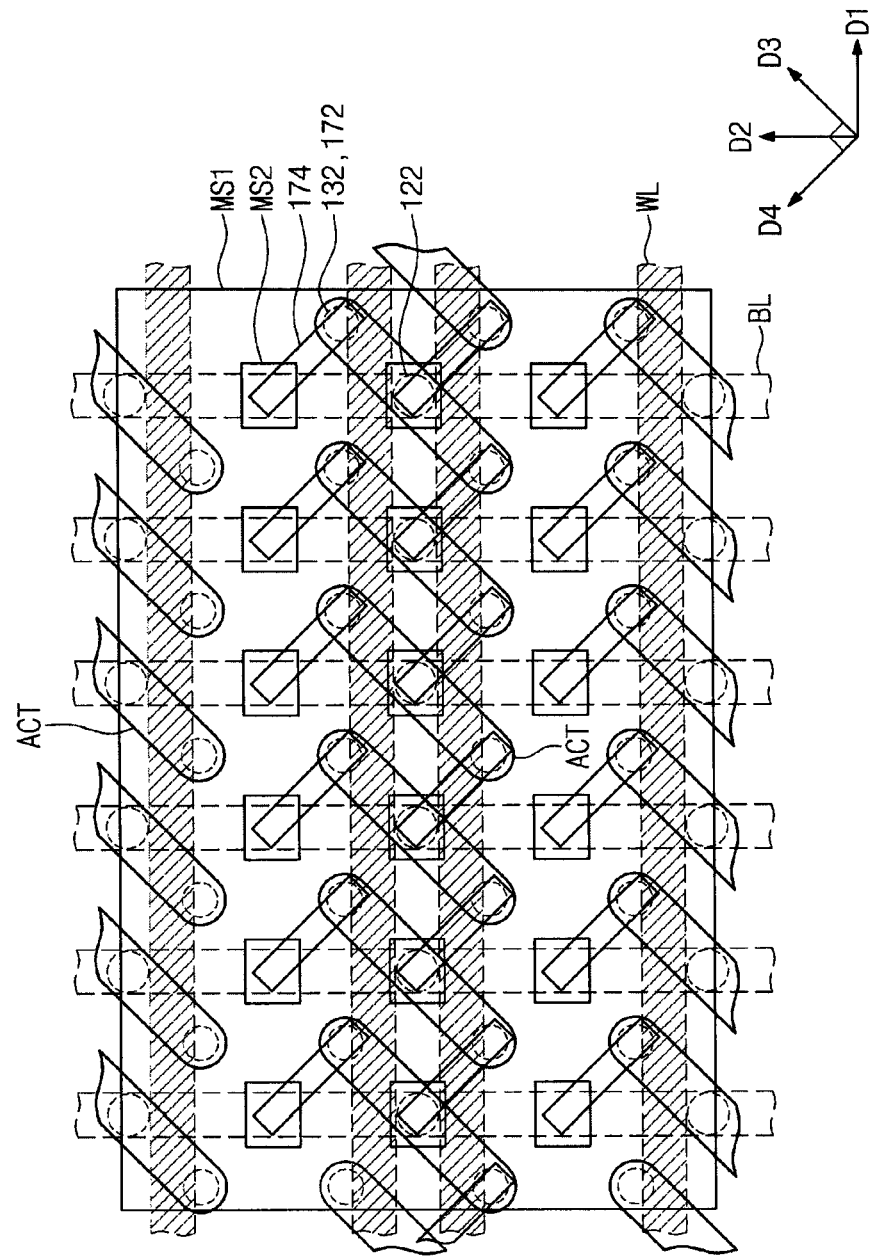
FIG. 14 is a plan view illustrating a magnetic memory device according to other embodiments of the inventive concepts.

FIG. 14 is a plan view illustrating a magnetic memory device according to other embodiments of the inventive concepts. Hereinafter, differences between the present embodiment and the above embodiment will be described. In other words, the same technical features as described in the above embodiment will be omitted or mentioned briefly for the purpose of ease and convenience in explanation.

A plurality of second magnetic patterns MS2 adjacent to each other may be spaced apart from each other at equal distances. The plurality of second magnetic patterns MS2 adjacent to each other may constitute a regular tetragon. In other words, the plurality of second magnetic patterns MS2 adjacent to each other may correspond to vertexes of the regular tetragon, respectively. Each of the second and third contact plugs 132 and 172 may be spaced apart by the same distance from the plurality of second magnetic patterns MS2 adjacent to each other. Each of the second and third contact plugs 132 and 172 may be disposed at a center of the regular tetragon constituted by the plurality of second magnetic patterns MS2 adjacent to each other.

Each of the connection pads 174 may extend in a fourth direction D4 perpendicular to the direction D3.

Figure 15:
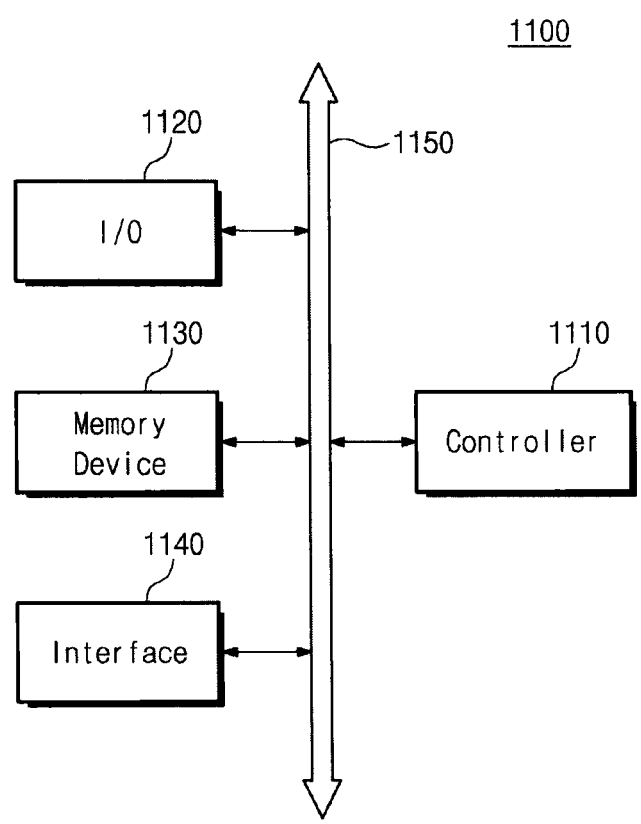
FIG. 15 is a schematic block diagram illustrating an embodiment of an electronic system including a magnetic memory device according to embodiments of the inventive concepts.

FIG. 15 is a schematic block diagram illustrating an embodiment of an electronic system including a magnetic memory device according to embodiments of the inventive concepts.

Referring to FIG. 15, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The memory device 1130 may include at least one of the magnetic memory devices according to the embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or a cable. For example, the interface unit 1140 may include an antenna or a wireless/cable transceiver. Although not shown in the drawings, the electronic system 1100 may further include a fast dynamic random access memory (DRAM) device and/or a fast static random access memory (SRAM) device which acts as a working memory device used for improving an operation of the controller 1110.

The electronic system 1100 may be applied to a personal digital assistant (PDA), a portable computer, a web tablet, a wireless phone, a mobile phone, a digital music player, or other electronic products. The other electronic products may receive and/or transmit information data by wireless.

Figure 16:
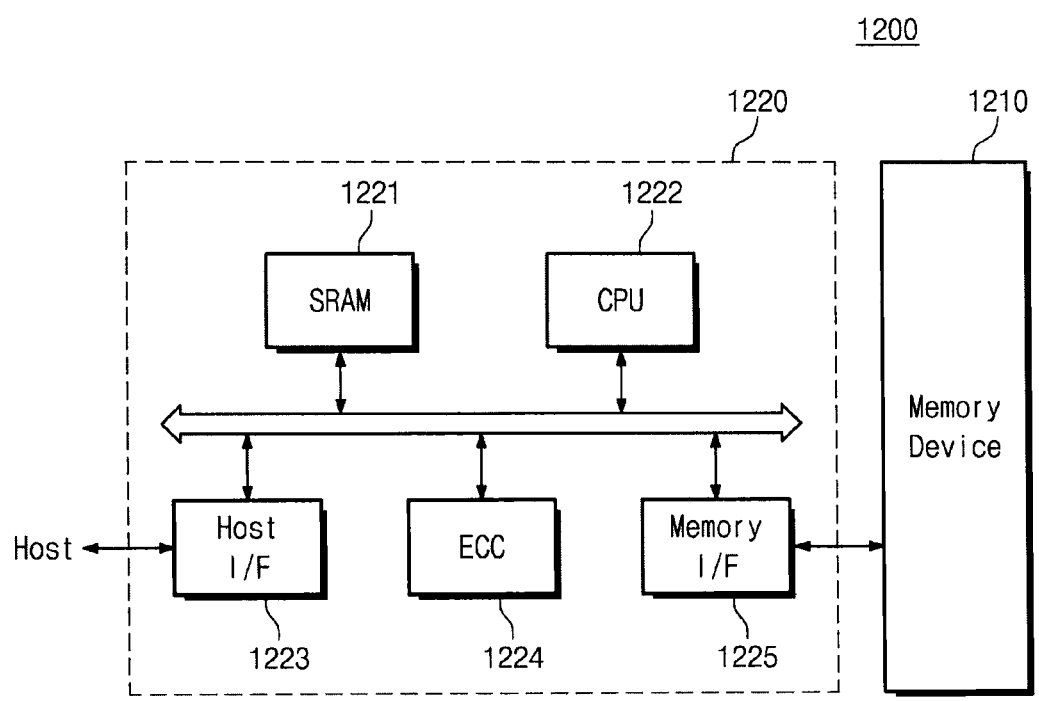
FIG. 16 is a schematic block diagram illustrating an embodiment of a memory system including a magnetic memory device according to embodiments of the inventive concepts.

FIG. 16 is a schematic block diagram illustrating an embodiment of a memory system including a magnetic memory device according to embodiments of the inventive concepts.

Referring to FIG. 16, a memory system 1200 includes a memory device 1210. The memory device 1210 may include at least one of the magnetic memory devices according to the embodiments of the inventive concepts. In addition, the memory device 1210 may further include another type of a semiconductor memory device which is different from the magnetic memory devices according to the embodiments described above. For example, the memory device 1210 may further include a DRAM device and/or a SRAM device. The memory system 1200 may include a memory controller 1220 that controls data communication between a host and the memory device 1210.

The memory controller 1220 may include a central processing unit (CPU) 1222 that controls overall operations of the memory system 1200. In addition, the memory controller 1220 may include an SRAM device 1221 used as a working memory device of the CPU 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory system 1200 may further include a read only memory (ROM) device that stores code data to interface with the host. The memory system 1200 may be used as a portable data storage card. Alternatively, the memory system 1200 may be realized as solid state disks (SSD) which are used as hard disks of computer systems.

According to embodiments of the inventive concepts, the pinned layer of the magnetic tunnel junction is not patterned but the free layer of the magnetic tunnel junction is patterned. Thus, it is possible to increase or improve an integration density of the magnetic memory device. In addition, by-products which may be generated during a patterning process of the pinned layer are not formed on the sidewalls of the free layer, so reliability of the magnetic memory device may be more improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device, comprising:
   a first magnetic pattern that is one united body on a substrate, the first magnetic pattern including a plurality of through-holes;
   a plurality of second magnetic patterns on the first magnetic pattern, the plurality of second magnetic patterns being spaced apart from each other;
   a tunnel barrier between the first magnetic pattern and the plurality of second magnetic patterns;
   a plurality of top electrodes on the plurality of second magnetic patterns, each top electrode being on a separate second magnetic pattern of the plurality of second magnetic patterns; and
   a plurality of plugs configured to electrically connect to the plurality of top electrodes through the plurality of through-holes, each plug of the plurality of plugs being configured to electrically connect to a single top electrode of the plurality of top electrodes through a single through-hole of the plurality of through-holes.

2. The magnetic memory device of claim 1, wherein,
   the first magnetic pattern has a fixed magnetization direction, and
   each of the second magnetic patterns has a changeable magnetization direction.

3. The magnetic memory device of claim 1, wherein each plug of the plurality of plugs includes,
   a first plug in a first interlayer insulating layer between the substrate and the first magnetic pattern;
   a second plug in a separate through-hole of the plurality of through-holes and a second interlayer insulating layer, the second interlayer insulating layer being between the second magnetic patterns; and
   a connection pad between the second plug and a separate top electrode of the plurality of top electrodes.

4. The magnetic memory device of claim 3, wherein the first plugs are laterally offset from the second magnetic patterns.

5. The magnetic memory device of claim 3, further comprising:
   a plurality of first spacers on separate, respective sidewalls of the second magnetic patterns,
   wherein the first spacers and the second interlayer insulating layer include different materials.

6. The magnetic memory device of claim 5, wherein sidewalls of the through-holes are self-aligned with sidewalls of the first spacers.

7. The magnetic memory device of claim 5, further comprising:
   a plurality of second spacers on separate, respective sidewalls of the plurality of through-holes,
   wherein the second spacers are configured to electrically insulate the second plugs from the first magnetic pattern.

8. The magnetic memory device of claim 5, wherein,
   the through-holes penetrate the tunnel barrier, and
   the tunnel barrier is between the second interlayer insulating layer and the first magnetic pattern.

9. A magnetic memory device, comprising:
   a substrate having a device isolation layer, the device isolation layer defining an active region;
   a pair of word lines extending in a first direction to intersect the active region;
   a plurality of plugs respectively connected to dopant regions in the active region, the dopant regions spaced apart from each other with the pair of word lines therebetween; and
   magnetic tunnel junctions laterally offset from the plugs,
   wherein each plug of the plurality of plugs is laterally spaced apart from a plurality of adjacent magnetic tunnel junctions at equal distances.

10. The magnetic memory device of claim 9, wherein the plurality of adjacent magnetic tunnel junctions are spaced apart from each other at equal distances.

11. The magnetic memory device of claim 9, wherein each plug of the plurality of plugs is at a center between a separate plurality of adjacent magnetic tunnel junctions.

12. The magnetic memory device of claim 9, wherein the magnetic tunnel junctions each include,
   a first magnetic pattern having a plate shape;
   a plurality of second magnetic patterns on the first magnetic pattern; and
   a tunnel barrier between the first magnetic pattern and the second magnetic patterns.

13. The magnetic memory device of claim 12, wherein,
   the plugs penetrate the first magnetic pattern, and
   the plugs are connected to the second magnetic patterns through separate, respective connection pads on separate, respective plugs of the plurality of plugs.

* * * * *